(12) United States Patent
Duxbury (10) Patent No.: US 6,460,154 B1
(45) Date of Patent: Oct. 1, 2002

(54) DATA ERROR CORRECTION SYSTEM

(75) Inventor: Guy M. A. F. Duxbury, Nepean (CA)

(73) Assignee: Nortel Networks Limited, St-Laurent (CA)

( * ) Notice: Subject to any disclaimer, the term of this patent is extended or adjusted under 35 U.S.C. 154(b) by 0 days.

(21) Appl. No.: 09/200,436

(22) Filed: Nov. 27, 1998

(51) Int. Cl.$^7$ .............................................. H03M 13/00
(52) U.S. Cl. ........................................ 714/751; 714/751
(58) Field of Search .............................. 714/751, 748, 714/746, 752, 756, 749, 750, 774, 776, 708, 209

(56) References Cited

U.S. PATENT DOCUMENTS

| | | | | |
|---|---|---|---|---|
| 3,641,494 A | | 2/1972 | Perrault et al. ........... | 340/146.1 |
| 3,893,072 A | * | 7/1975 | D'Antonio et al. .......... | 714/751 |
| 4,149,142 A | | 4/1979 | Kageyama et al. ....... | 340/146.1 |
| 4,649,543 A | * | 3/1987 | Levine ....................... | 714/774 |
| 4,730,313 A | * | 3/1988 | Stephenson et al. ........ | 714/708 |
| 5,010,553 A | * | 4/1991 | Scheller et al. ............. | 714/751 |
| 5,031,179 A | * | 7/1991 | Yoshida et al. ............. | 714/748 |
| 5,793,744 A | * | 8/1998 | Kanerva et al. ............ | 370/209 |
| 6,052,812 A | * | 4/2000 | Chen et al. ................. | 714/751 |
| 6,052,819 A | * | 4/2000 | Barker et al. ............... | 714/776 |

* cited by examiner

*Primary Examiner*—Albert Decady
*Assistant Examiner*—Emeka J. Amanze (57) ABSTRACT

The invention is a modem and associated method of data transmission which improve the protection afforded to data under conditions of occasional impulsive noise. The modem is ideally suited for use with another modem of similar type in a system whereby data is transmitted as a sequence of frames in either direction. Each modem applies forward error correction (FEC) to frames transmitted to the other modem. If a particular frame is corrupted on its way from a "first" modem to a "second" modem, the second modem attempts to correct these errors. If it is unable to do so, then the second modem will request a retransmission by placing a binary encoded message in the error field of a frame transmitted towards the first modem. The binary encoded message is itself protected from errors by a suitable combination of zeroes and ones. The second modem then sets a timer and subsequently ignores all frames received from the first modem until the timer expires. Meanwhile, the first modem continuously verifies the error field in each frame received from the second modem and if it identifies the request for retransmission, it sends back all the frames transmitted between the present time and a time in the past corresponding to the expiry time of the timer in the second modem. In an exactly analogous way, the first modem can request retransmission of frames from the second modem.

27 Claims, 3 Drawing Sheets

DATA ERROR CORRECTION SYSTEM

FIELD OF THE INVENTION

The present invention relates to modems and in particular to a method and apparatus for enhancing the performance of modems employing forward error correcting codes under conditions of impulsive noise.

BACKGROUND OF THE INVENTION

Modems are commonly used to transmit and receive data across communications media such as optical fiber, copper wire and coaxial cable. Most typically, the final link leading from a central office to a subscriber's home is of the copper twisted pair variety, which is usually poorly shielded and thus exposed to sources of noise which may corrupt the signals travelling thereon.

Some noise sources, such as thermal noise and crosstalk, are relatively time-invariant and their effects are either controllable (to a certain extent) or can be cancelled through the use of special techniques for coding the transmitted data. Other sources of noise are impulsive, i.e., they occur for a limited time and are generally unpredictable, such as lightning or the passing of a locomotive. Numerous prior art techniques have been developed to tackle these two types of noise; among these, forward error correction and interleaving are often used in combination to alleviate data corruption due to both time-invariant and impulsive noise sources.

Forward error correction, or FEC for short, consists of partitioning the data to be transmitted into sequential frames of data bits and appending several additional bits (so-called FEC overhead bits) to each frame. The FEC overhead bits in each frame represent the result of mathematical calculations performed on various sections of the data bits in the frame. The mathematical operations are specially chosen to permit a limited number of errors in the data bits to be corrected by the receiver performing similar operations and subsequently examining the FEC overhead bits.

Good FEC algorithms will typically provide correction for up to 9 bytes out of 200 with an associated bandwidth overhead on the order of 5 percent. However, impulsive noise may be of a significant duration and thus may corrupt frames beyond correctability by the FEC algorithm in use. To mitigate the effect of lengthy bursts of impulsive noise on a transmitted data signal, prior art modems employ a technique known as interleaving. Using this approach, data frames are segmented and the individual segments from a number of consecutive frames are interleaved.

It is conventional to interleave data spanning a period of 20 or more times the duration of the maximum impulse to be survived. Thus, when affected by a burst having the duration of one-half frame, the effect of the burst is to in fact corrupt each of at least 10 consecutive frames by at most 5% of the bits contained therein. The corrupted frames then easily lend themselves to correction by a standard FEC algorithm.

Unfortunately, a practical system employing sufficient interleaving to reduce error rates for multimedia traffic will introduce a delay on the order of nine milliseconds before the first bit in the first frame is actually transmitted. For real-time applications such as telephony, such long delays caused by a transmitting modem are unacceptable, especially since a de-interleaving procedure, which introduces an additional delay of similar magnitude, must be performed at the receiver. In addition, there are considerable memory requirements at both transmitter and receiver when storing dozens of frames, each of which may have a length of 250 bytes or more.

Therefore, there is a need for a modem with error correction which improves the protection afforded to data under conditions of impulsive noise, while continuing to minimize both the amount of overhead bandwidth introduced by the corrective measures applied by the modem and the delay through the modem.

SUMMARY OF THE INVENTION

It is an object of the present invention to mitigate or obviate one or more disadvantages of the prior art.

Therefore, the invention may be summarized according to a first broad aspect as a method of communicating frames of digital data across a communications medium extending between a first modem and a second modem, each frame comprising a data field and an error field, the first modem having a first startable timer, comprising the steps of: the first modem receiving a first set of frames sent by the second modem; the first modem determining, for each frame in the first set, whether the data field in the frame is error-free, contains correctable errors or contains uncorrectable errors; if the data field is error-free, the first modem verifying whether the first timer is running and if so, discarding the data field, otherwise forwarding the data field to a first digital interface; if the data field contains correctable errors, the first modem correcting said errors and verifying whether the first timer is running and if so, discarding the data field, otherwise forwarding the corrected data field to the first digital interface; if the data field contains uncorrectable errors, the first modem verifying whether the first timer is running and if so, discarding the data field, otherwise encoding a first error message into the error field of a first frame, sending the first frame to the second modem and starting the first timer to time out after a predetermined expiry time.

According to a second broad aspect, the present invention may be summarized as a method of communicating frames of digital data across a communications medium extending between a first modem and a second modem, each frame comprising a data field and an error field, the first modem having a first startable timer, comprising the steps of: the first modem receiving a first set of frames sent by the second modem; for each frame in the first set, the first modem verifying whether the first timer is running and if so, discarding the data field in the frame; otherwise, the first modem determining whether the data field in the frame is error-free, contains correctable errors or contains uncorrectable errors; if the data field is error-free, the first modem sending the data field to a first digital interface; if the data field contains correctable errors, the first modem correcting said errors and sending the corrected data field to the first digital interface; if the data field contains uncorrectable errors, the first modem discarding the data field, encoding a first error message into the error field of a first frame, sending the first frame to the second modem and starting the first timer to time out after a predetermined expiry time.

The invention may be summarized according to a third broad aspect as a modem for connection to a transmission medium and to a digital communications device, the modem comprising: analog interfacing means for connection to the transmission medium and for separating a bidirectional analog signal travelling on the transmission medium into a first received stream of frames and a second transmitted stream of frames, each frame comprising a data field and an error field; error message detection means connected to the analog interfacing means, for detecting a retransmission request in the data field of frames in the received stream of frames and producing both a "retransmission request" message and a second received stream of frames; error correction decoding means connected to the error message detector, the error correction decoding means comprising a startable timer, for producing an "uncorrectable error" message and error-free data stream from the second received stream of frames; digital interfacing means connected to the error correction decoding means, to the error message detection means and for connection to the digital communications device, for transmitting the error-free data stream to the device, for receiving and temporarily storing an original data stream from the device and for retransmitting previously stored portions of the original data stream upon receipt of said "retransmission request" message from the error message detection means; error correction encoding means connected to the digital interfacing means, for increasing redundancy of the original data stream, thereby to produce a first transmitted stream of frames; an error message inserter connected to the error correction encoding means, to the error correction decoding means and to the first interfacing means, for encoding an error message into the first transmitted stream of frames upon receipt of said "uncorrectable error" message from the error correction decoding means, thereby to produce the second transmitted stream of frames.

BRIEF DESCRIPTION OF THE DRAWINGS

The preferred embodiment of the present invention will now be described with reference to the following figures, in which.

DETAILED DESCRIPTION OF THE PREFERRED EMBODIMENT

Figure 1:
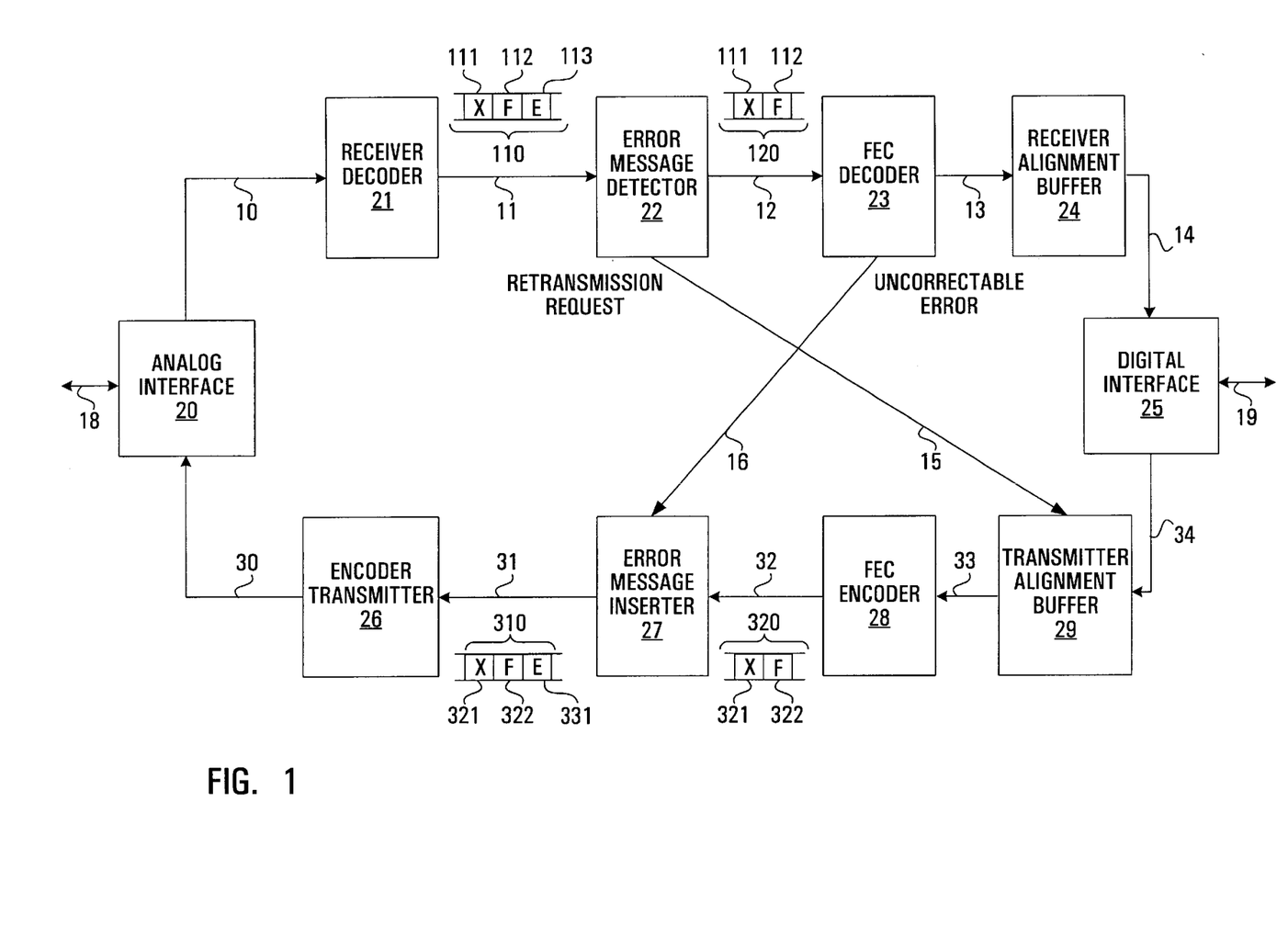
FIG. 1 is a block diagram of a modem in accordance with the preferred embodiment of the present invention.

Referring to FIG. 1, there is shown a block diagram of a modem 1 in accordance with the present invention. It is contemplated that the illustrated modem 1 will be one of a pair of modems used for exchanging data across a communications medium such as a radio link, a coaxial cable or a copper twisted pair. There exists a propagation delay between the illustrated modem 1 and the other modem, which may be time varying due to thermal effects and which may be different in either direction.

The inventive modem 1 comprises an analog interface 20 for sending and receiving a bidirectional analog signal 18 across the communications medium. The modem 1 also comprises a digital interface 25 for exchanging digital data 19 with computers, multimedia equipment or a digital switch.

Connected between the analog interface 20 and the digital interface 25 is a receive section, consisting of a receiver/decoder 21 in series with an error message detector 22, a forward error correction (FEC) decoder 23 and a receiver alignment buffer 24. The modem 1 further comprises a transmit section, also connected between the analog and digital interfaces, comprising a series arrangement of a transmitter alignment buffer 29, an FEC encoder 28, an error message inserter 27 and an encoder/transmitter 26.

The receive and transmit sections are also cross-connected by virtue of the error message detector 22 supplying a "retransmission request" message 15 to the transmitter alignment buffer 29 and the FEC decoder 23 providing an "uncorrectable error" message 16 to the error message inserter 27.

Figure 2:
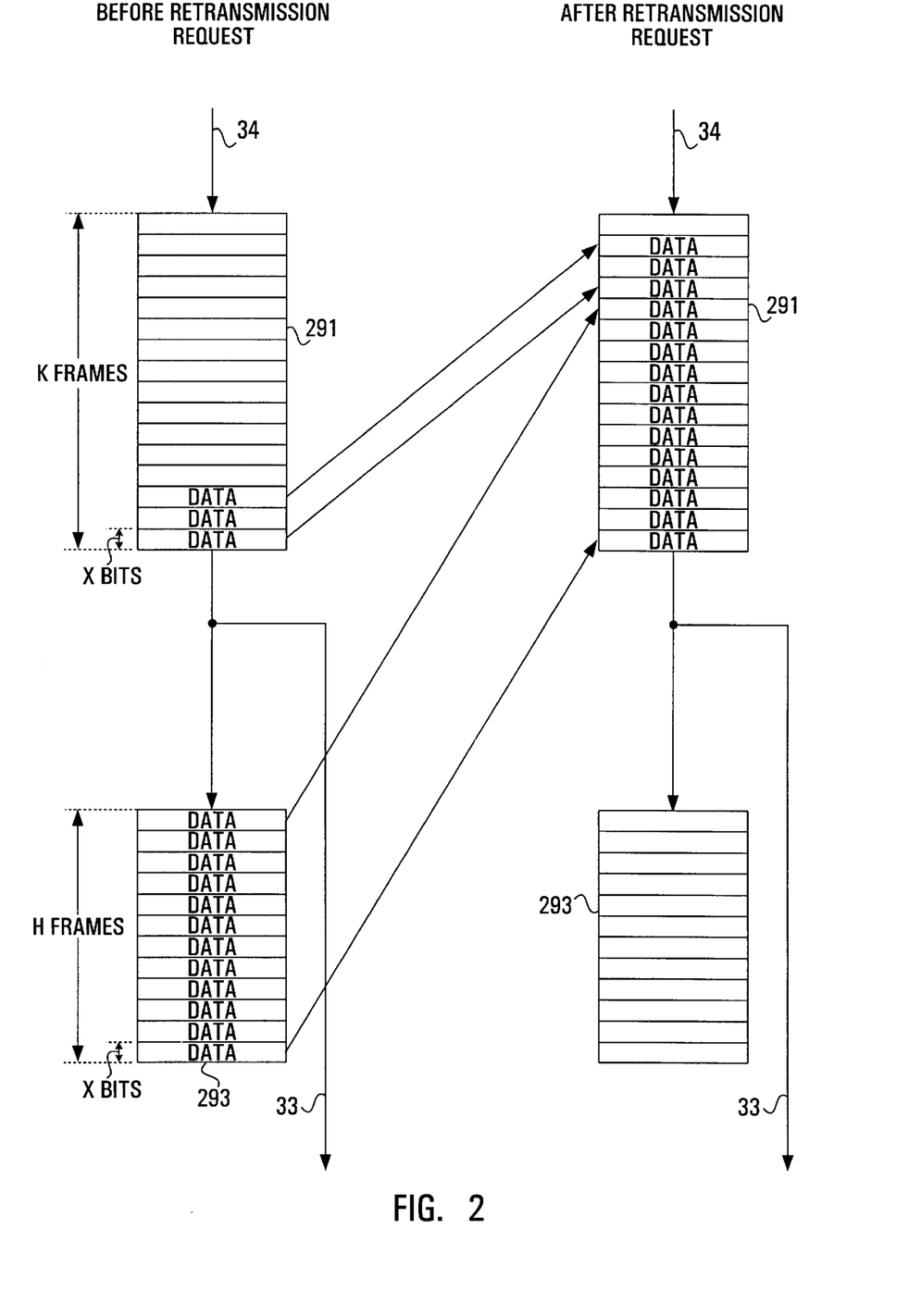
FIG. 2 is a functional diagram of the transmitter alignment buffer in FIG. 1.

Considering first the structure of the transmit section in greater detail, the transmitter alignment buffer 29 is preferably implemented as a software-addressable queue controlled by a software controller. Alternatively, the transmitter alignment buffer 29 is implementable in hardware. FIG. 2 shows, in block diagram form, the transmitter alignment buffer 29 as comprising a pre-transmission buffer 291 and a history buffer 293 connected to the pre-transmission buffer 291.

A bit stream 34 from the digital interface 25 is stored it in the pre-transmission buffer 291, which has space for K frames of X bits each. The pre-transmission buffer 291 produces another bit stream 33, which is fed to the FEC encoder 28. In addition, frames leaving the pre-transmission buffer 291 also enter a history buffer 293 which holds H frames of X bits each.

As will be described further on, the software controller (not shown in FIG. 2) accepts the "retransmission request" message 15 from the error message detector 22 and controllably inserts the H frames contained in the history buffer 293 into the pre-transmission buffer 291 by pushing back the frames currently contained in the pre-transmission buffer 291.

The FEC encoder 28 and error message inserter 27 are also preferably, but not necessarily exclusively, implemented in software. The FEC encoder 28 is a commonly used component in the prior art, producing a bit stream 32 from bit stream 33 as shown in FIG. 1. The error message inserter 27 is an inventive component which converts the bit stream 32 into yet another bit stream 31 fed to the encoder/transmitter 26.

The last component in the transmit section is the encoder/transmitter 26, which accepts the bit stream 31 from the error message inserter 27 and produces a transmitted analog signal 30 that is fed to the analog interface 20. The encoder/transmitter 26 comprises an encoder, for converting the bit stream 31 into one or more sequences of bits or multi-level digital samples. In addition, the encoder/transmitter comprises an optional modulator for modulating the one or more sequences onto one or more carriers, as well as a digital-to-analog converter for converting the (possibly modulated) signal or signals into the transmitted analog signal 30. Suitable modulation techniques applied by the modulator include quadrature amplitude modulation (QAM), carrier-less amplitude and phase (CAP) modulation, quadrature phase-shift keying (QPSK), discrete multi-tone (DMT), among others.

Considering now the structure of the receive section of the modem in FIG. 1, the analog interface 20 feeds a received analog signal 10 to the receiver/decoder 21, which is a prior art component essentially performing the inverse operations of the encoder/transmitter, that is to say, analog-to-digital conversion, demodulation (if applicable) and decoding. The resultant signal is a bit stream 11 fed to the error message detector 22.

The error message detector 22 is an inventive component, implementable on a digital signal processor, which converts bit stream 11 into a bit stream 12 feeding the FEC decoder 23. The FEC decoder 23 is also an inventive component implementable on a digital signal processor, and is used for detecting and correcting errors in bit stream 12, thereby to produce an error-free bit stream 13 fed to the receiver alignment buffer 24. Furthermore, the FEC decoder 23 comprises a startable timer to be described later. Finally, the receiver alignment buffer 24 reduces jitter by temporarily storing the bits arriving on the bit stream 13, producing a bit stream 14 that is fed to the digital interface 25.

Operation of the transmit section is now considered with continued reference to FIG. 1. Specifically, the digital interface 25 provides the transmitter alignment buffer 29 with bit stream 34 for eventual transmission to the other modem, not shown in FIG. 1. Bit stream 34 preferably consists of frames of data of length X bits each; suitable types of data include binary sequences of "raw" data as well as packetized data such as ATM cells. In the case of ATM, no distinction is made by the transmitter alignment buffer 29 (and, in general, the modem) between the 5-byte header and the 48-byte payload of each ATM cell.

At the transmitter alignment buffer 29, X-bit frames received in bit stream 34 from the digital interface are inserted into the pre-transmission buffer 291. The transmitter alignment buffer 29 then sends X-bit frames from the pretransmission buffer 291 onto bit stream 33. In accordance with the present invention, the transmitter alignment buffer 29 may delay the extraction of frames previously contained in the pre-transmission buffer 291 by inserting therein the contents of the history buffer 293.

The decision concerning whether or not to translate the contents of the history buffer 293 into the pre-transmission buffer 293 is made by the software controller (not shown), based on the "retransmission request" message 15 received from the error message detector 22. Generation of the "retransmission request" message 15 by the error message detector 22 is explained later on in greater detail. For now, it is sufficient to bear in mind that the "retransmission request" message 15 has one of two possible states, i.e., it can indicate whether frame retransmission has or has not been requested by the other modem.

Regardless of how it is generated, if the "retransmission request" message 15 indicates that frame retransmission has been requested, then the frames in the history buffer 293 are inserted into the pre-transmission buffer 291, i.e., previously transmitted frames are retransmitted. Conversely, if the "retransmission request" message 15 indicates that frame retransmission has not been requested, then the pre-transmission buffer 291 is left intact.

The "retransmission request" message 15 is a request made by the other modem but detected by the error message detector 22 in the modem 1 in FIG. 1. When determining the appropriate size for the history buffer 293, it is thus necessary to evaluate the amount of time elapsed since the request was made by the other modem. This time delay corresponds to:

the time taken by the other modem to generate and output an error message requesting retransmission; the propagation time from the other modem to modem 1 along the communications medium; the time delay incurred by the analog interface 20, the receiver/decoder 21 and the error-message detector 22 at the modem 1; the time delay incurred by the analog interface 20, receiver/decoder 21, error message detector 22 and transmitter alignment buffer 29 in generating a first retransmitted frame, the delay incurred by the error message inserter 27, encode/transmitter 26 and analog interface 20 in sending the first retransmitted frame onto the communications medium; the propagation time from the modem 1 to the other mode; and the time delay incurred by the other modem before recognizing that the received frame is the first retransmitted frame.

Therefore, the number of frames in the history buffer 293 should preferably reflect the maximum expected delay for a retransmission request to arrive from the other modem. This delay, corresponding to the desired number H of frames in the history buffer 293, may be calculated experimentally during a handshaking procedure routinely initiated between two modems or may be entered by a system operator at an input terminal. Since the transmission alignment buffer 29 is implementable in software, H can be tailored to the specific operating environment of the modem.

Due to the possibility of H additional frames being inserted into the pre-transmission buffer 291, it would appear that K must be significantly greater than H. However, it is observed that insertion of the H frames into the pre-transmission buffer occurs only after the "retransmission request" message 15 indicates that the other modem has asked for a retransmission. If, in addition, the data rate of bit stream 33 is higher than that of bit stream 34 by a small percentage (typically 1%), the pre-transmission buffer 291 will be almost empty during times of error-free transmission. Therefore, K is preferably on the order of H or less.

Bit stream 33 leaving the transmitter alignment buffer 29 thus contains data frames of length X bits each (and at a slightly higher rate than the data rate of bit stream 34). This bit stream enters the FEC encoder 28 where a forward error correction (FEC) algorithm is applied to each data frame. Any one of many known forward error correction algorithms may be used, most of which consist of appending a certain number F of overhead bits to each data frame, where the F bits contain the result of mathematical operations performed on the X data bits.

Thus, the output of the FEC encoder 28 is a bit stream 32 consisting of frames 320 of length X+F bits, each of which comprises a data field 321 of length X bits containing the frames supplied by the transmitter alignment buffer 29 on bit stream 33, along with an FEC overhead field 322 of length F bits containing the FEC overhead bits. Preferably, F is less than or equal to five percent of X.

At the error message inserter 27, a number E of error bits are added to each frame 320 of the incoming bit stream 32. Thus, in addition to comprising the data field 321 and the FEC overhead field 322, the frames 310 leaving the error message inserter 27 also have an error field 331. The value of these error bits is set by the error message inserter 27 on the basis of the "uncorrectable error" message 16 received from the FEC decoder 23.

Operation of the FEC decoder 23 is described in further detail later; at this stage, it is sufficient only to know that the "uncorrectable error" message 16 transmitted by the FEC decoder 23 tells the error message inserter 27 whether or not the frame currently being decoded by the FEC decoder in the receive section of the modem contains errors which cannot be corrected by the FEC decoder.

If there are such uncorrectable errors, the error message inserter 27 sets the E error bits to a first combination; otherwise, the E error bits are set to a second combination. Preferably, the two combinations are fixed, complementary and both comprise combinations of ones and zeroes. This form of redundant coding is known as "multicode" and increases the chances of successfully receiving the "uncorrectable error" message at the other modem (not shown).

Bit stream 31 exiting the error message inserter 27 then enters the encoder/transmitter 26, which preferably encodes the bits in each frame 310 of bit stream 31 into at least one sequence of binary or multi-level digital values, modulates the sequence of values about at least one carrier frequency (if appropriate) and converts the resultant signal to analog form, producing the analog transmit signal 30 fed to the analog interface 20. Suitable types of modulation include QAM, CAP, DMT, QPSK, although any other modulation format may be used. Moreover, the order of encoding, modulation and digital-to-analog conversion may be interchanged without affecting the functionality of the present invention.

Operation of the receive section is now described. In particular, the receiver/decoder 21 receives the analog receive signal 10, on which it performs essentially the inverse operations of the encoder/transmitter 26. Thus, the received analog signal 10 is converted to digital form, demodulated (if applicable) and subsequently decoded into bit stream 11 that is fed to the error message detector 22. Since the other modem (not shown) is presumed to be using the same transmission scheme as the modem 1 in FIG. 1, bit stream 11 will ideally consist of a sequence of frames 110, each comprising a data field 111 of length X bits, an FEC overhead field 112 of length F bits and an error field 113 of length E bits.

The error message detector 22 then strips off the error field 113 and reads the E bits contained therein. If the E bits in the error field 113 (i.e., the "uncorrectable error" message as transmitted by the other modem) correspond to the first combination mentioned above, then the other modem has requested frame retransmission, whereas if the E bits in the error field 113 correspond to the second combination then no frame transmission has been requested. In either case, the significance of the E error bits in the error field 113 is communicated by the error message detector 22 to the transmitter alignment buffer 29 in the form of "retransmission request" message 15. The response of the transmitter alignment buffer 29 to such a message has been detailed above.

Of course, it is possible that the error field 113 itself has been corrupted on its way from the other modem (not shown), and therefore the E bits in the error field 113 correspond neither to the first nor to the second combination mentioned above. In this case, the error message detector 22 is left with "guessing" whether the other modem (not shown) did actually request frame retransmission. One way of efficiently assessing this probability is to verify the number of bits that are different between the received combination and the first or second known combinations. If the first and second combinations are complementary, then the task is simplified, since only one comparison need be made.

By way of example, let the sequence 110010 represent a condition of no retransmission request and the (complementary) sequence 001101 represent a condition of a retransmission being requested by the other modem (not shown). Since the two sequences are complementary, only one comparison need be effected to determine the number of error bits properly received by the modem. Assuming that the bits in the error field 113 are compared to 110010 and if these bits were not corrupted on their way from the other modem (not shown), then the received combination will either have no errors at all or errors in all six positions. The only way that there can be between 1 and 5 errors (inclusively) is if the bits in the error field 113 were corrupted on their way from the other modem (not shown).

If exactly one bit is in error, then it can be reasonably assumed that the received combination is a corrupted version of the combination 110010. Similarly, if 5 bits are found to be in error, then the received combination is reasonably assumed to be equal to the complementary combination 001101. When 2 or 4 bits are in error, validity of any such assumptions is somewhat eroded, and the decision is to be somewhat biased when the probability of guessing correctly approaches 50%.

In an extreme case of ambiguity, i.e., when exactly three out of six bits are in error, then it is impossible to make even an educated guess as to whether or not a retransmission was requested. Since it is preferable to retransmit even if retransmission were not requested as compared to not retransmitting when retransmission was indeed requested, the error message detector 22 can be biased towards making the decision that retransmission was requested. Desirably, this bias should be limited, since very heavily biasing the error message detector in this direction can significantly increase the output data rate required for the transmitter alignment buffer 29.

In any event, the error message detector 22 removes the error field 113 from its incoming frames 110 and produces a bit stream 12 that is fed to the FEC decoder 23. The bit stream 12 consists of frames 120 containing the X-bit data field 111 as well as the F-bit FEC overhead field 112. The FEC decoder 23 applies an algorithm to each frame 120, as described with additional reference to the flowchart in FIGS. 3.

Figure 3:
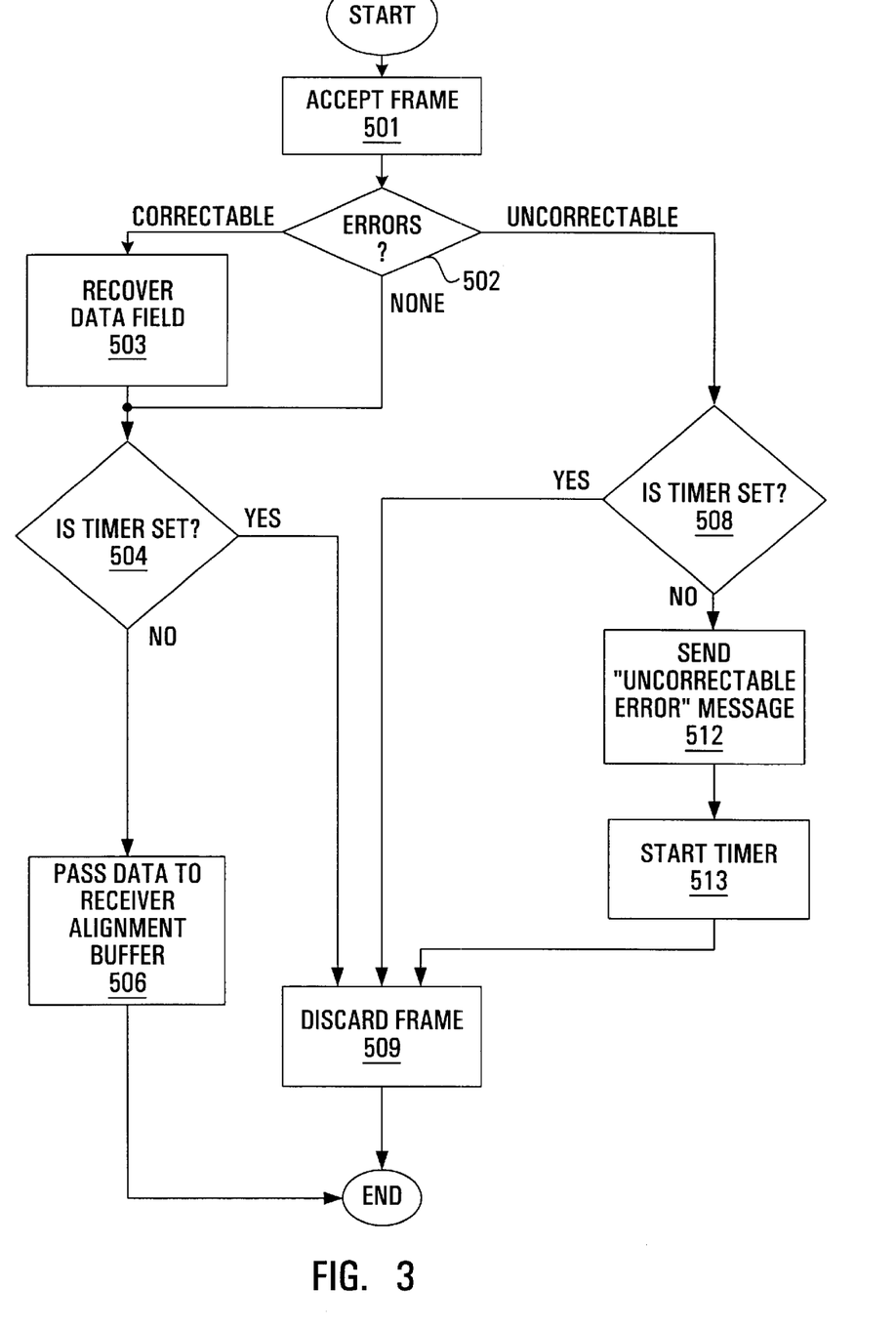
FIG. 3 is a flowchart describing operation of the FEC decoder in FIG. 1.

The algorithm begins at step 501 with a specific frame 120 being accepted by the FEC decoder 23. At step 502, the frame 120 is checked for errors by the FEC decoder 23 applying the detection portion of a known forward error correction algorithm. If the FEC decoder 23 determines that frame 120 contains errors that are uncorrectable, the "UNCORRECTABLE" path is taken out of step 502, leading to step 508.

At step 508, the FEC decoder 23 verifies whether its local timer has been started. This local timer is to be started each time a new "uncorrectable error" message is about to be sent to the error message inserter 27 and remains set until the end of an expiry time. This expiry time has a duration equal to the time which elapses between recognizing that the frame 120 has uncorrectable errors and the time at which a first retransmitted frame can be received and includes:

the time delay for modem 1 to generate and output an error message requesting retransmission with the aid of the error message inserter 27, the encoder/transmitter 26 and the analog interface 20; the propagation time from modem 1 to the other modem along the communications medium; the time delay incurred by the analog interface, the receiver/decoder and the error-message detector at the other modem; the time delay incurred by the other modem for outputting the first retransmitted frame onto the transmission medium; the propagation time from the other modem to modem 1 along the communications medium; and the time delay at modem 1 through the analog interface 20, the receiver/decoder 21 and the error message inserter 22.

It is seen that this expiry time is exactly equal to the time corresponding to the number of frames in the history buffer of the other modem (a retransmission of which has been requested). Because propagation times may differ in either direction of communication and because processing times may differ from modem to modem, it is to be appreciated that the expiry time of the timer in the modem 1 may be slightly different from the time corresponding to the H frames in its own history buffer 293. Since the value of H for each modem will be determined during an initial handshaking routine or via user input, this automatically sets the expiry time for the complementary modem.

Returning now to the description of FEC decoder operation, all frames received while the local timer is set are to be discarded by the FEC decoder 23 (step 509) and the timer is not to be restarted until it expires. If, however, the local timer has not been set, then as shown at step 512, the FEC decoder 23 will signal the presence of uncorrectable errors by sending an "uncorrectable error" message 16 to the error message inserter 27, effectively asking for a retransmission in the manner described above. At step 513, the FEC decoder subsequently starts its local timer in order to indicate that the "uncorrectable error" message 16 has been sent to the error message inserter 27.

Referring again to step 502, if the frame 120 contains correctable errors, e.g., 9 or fewer corrupted bytes out of a total of 200 or so, then the "CORRECTABLE" path is taken out of step 502, leading to step 503 where the FEC decoder 23 applies the correction portion of the FEC algorithm to correct these errors, thereby to recover the originally transmitted bits in the data field 111.

After the correctable errors have been recovered (or if the frame 120 is error-free), the algorithm in FIG. 3 proceeds to step 504, where the FEC decoder 23 verifies whether or not the local timer is running. If this is indeed the case, then the received frame 120 is to be discarded as previously described with reference to step 509. However, if the local timer has not been started (step 506), the frame 120 is converted to bit stream 13 and sent to the receiver alignment buffer 24.

It is to be appreciated that it may be more efficient to first verify whether the timer is running and if so, to discard the frame but otherwise to proceed to verify whether there are uncorrectable or correctable errors in the frame 120. In this case, if there are uncorrectable errors, the FEC decoder is to send an "uncorrectable error" message 16 to the transmitter alignment buffer 29 and start the timer. If there are correctable errors, the FEC decoder is to correct these errors and send the corrected data field to the receiver alignment buffer 24. If there are no uncorrectable errors, the FEC decoder is simply to send the data field to the receiver alignment buffer 24.

The behaviour of the X-bit frames entering the receiver alignment buffer 24 may be characterized as bursty due to interruptions of input data flow between occasional frame retransmissions. However, the digital interface 25 requires bit stream 14 to have a relatively constant bit rate. This mismatch between input and output bit rates at the receiver alignment buffer 24, known as jitter, can be smoothed out by simple buffering using, for instance, a first-in first-out (FIFO) queue.

While the preferred embodiment of the present invention has been described and illustrated, it will be apparent to persons skilled in the art that numerous modifications and variations are possible. For example, it may be desirable to distinguish frames that are being retransmitted from frames that are not so classified. This can be achieved in the transmitter alignment buffer 29 by "tagging" each frame entering the pre-transmission buffer 291 with a zero bit and tagging each frame entering the history buffer 293 with a one bit.

Thus the other modem requesting a retransmission will result in an error message being sent to the modem 1 in FIG. 1. When the error message detector 22 detects this error message, a "retransmission request" message 15 is sent to the transmitter alignment buffer 29, which inserts the H frames in the history buffer 293 into the pre-transmission buffer 291, but preserving the tagged bit of each frame as a logical "1".

At the FEC decoder in the other modem, it is thus possible to determine whether or not subsequent received frames are retransmitted frames, based simply upon the value of the tagged bit of each frame. Hence, it is not necessary to set a timer and blindly discard all frames arriving until expiry of the timer; instead, each frame's tag is examined and the frame is discarded until the first retransmitted frame is identified.

In another alternate embodiment of the present invention, it is possible to reduce the overhead bandwidth of the inventive system by responding to a "retransmission request" message in the following manner: Instead of transmitting all H frames in the history buffer, it may be desirable to send only the oldest frame, i.e., the one actually requiring retransmission. At the FEC decoder in the other modem, the H-1 frames received following the transmission of an error message are not ignored. Instead, the FEC decoder stores an internal pointer to the frame requiring retransmission and when this frame is eventually received by the FEC decoder, it is placed at the correct position relative to the H-1 other frames received in the meantime.

Finally, it is to be considered that in the transmit section of the modem 1, the FEC encoder 28 may precede the transmitter alignment buffer 29. This has two advantages when considering the situation in which a retransmission request has been generated by the other modem and detected by the error message detector 22. First, FEC encoding is performed only once for each frame, i.e., prior to entry into the transmitter alignment buffer 29, thereby reducing the processing demands on the FEC encoder 28. A second advantage is realized by having reduced the delay incurred by the modem in responding to the retransmission request.

In addition to the variations discussed herein, persons skilled in the art will appreciate the existence of other workable alternative embodiments of the present invention. The scope of the invention, therefore, is only to be limited by the claims appended hereto.

I claim:

1. A method of communicating frames of digital data across a communications medium extending between a first modem and a second modem, each frame comprising a data field and an error field, the first modem having a first startable timer, comprising the steps of:

the first modem receiving a first set of frames sent by the second modem;

the first modem determining, for each frame in the first set, whether the data field in the frame is error-free, contains correctable errors or contains uncorrectable errors;

if the data field is error-free, the first modem verifying whether the first timer is running and if so, discarding the data field, otherwise forwarding the data field to a first digital interface;

if the data field contains correctable errors, the first modem correcting said errors and verifying whether the first timer is running and if so, discarding the data field, otherwise forwarding the corrected data field to the first digital interface;

if the data field contains uncorrectable errors, the first modem verifying whether the first timer is running and if so, discarding the data field, otherwise encoding a first error message into the error field of a first frame, sending the first frame to the second modem and starting the first timer to time out after a predetermined expiry time;

wherein said predetermined expiry time is equal to an amount of time required for a retransmitted version of a given frame to be received at the first modem following starting of the timer as a result of having determined that the given frame has uncorrectable errors.

2. A method according to claim 1, wherein the first error message inserted into the error field of the first frame comprises a plurality of bits arranged in a first or a second combination, the first combination indicating that frame retransmission is required and the second combination indicating that no frame retransmission is required.

3. A method according to claim 2, wherein the first and second combinations are complementary and each comprise both logical ones and logical zeroes.

4. A method according to claim 1, wherein each frame further comprises an error correction overhead field, wherein frames transmitted by the first modem are forward error corrected by a forward error correction algorithm and wherein the error correction overhead field of each frame contains results of the error correction algorithm.

5. A method according to claim 4, wherein the step of determining, for each frame in the first set, whether the data field of said frame is error-free, contains correctable errors or contains uncorrectable errors consists of executing a forward error correction algorithm on the error correction overhead field of said frame.

6. A method according to claim 1, further comprising the steps of:
the second modem receiving a second set of frames from the first modem, including the first frame;
the second modem detecting the first error message in the error field of the first frame;
the second modem retransmitting to the first modem at least the frame having caused the first modem to start the first timer; and
the first modem receiving retransmitted frames from the second modem.

7. A method according to claim 6, further comprising the step of the second modem further retransmitting all other frames in the first set of frames since the frame having caused the first modem to start the first timer.

8. A method according to claim 6, further comprising the step of the second modem identifying with an additional tag bit each retransmitted frame in the first set of frames.

9. A method according to claim 6, wherein the first timer has an expiry time equal to the sum of:
the time delay for the first modem to encode the first error message into the error field of the first frame and to send the first frame to the second modem;
the time delay for the second modem to receive the first frame;
the time delay for the second modem to detect the first error message in the error field of the first frame;
the time delay for the second modem to retransmit a first retransmitted frame;
the time delay for the first modem to receive the first retransmitted frame from the second modem.

10. A method according to claim 9, wherein the expiry time of the first timer is determined by the first and second modems executing a handshaking routine.

11. A method according to claim 6, the second modem having a second startable timer, the method further comprising the steps of:
the second modem determining, for each frame in the second set, whether the data field in the frame is error-free, contains correctable errors or contains uncorrectable errors;

if the data field is error-free, the second modem verifying whether the second timer has been started and if so, discarding the data field, otherwise forwarding the data field to a second digital interface;
if the data field contains correctable errors, the second modem correcting said errors and verifying whether the second timer has been started and if so, discarding the data field, otherwise forwarding the corrected data field to the second digital interface;
if the data field contains uncorrectable errors, the second modem verifying whether the second timer has been started and if so, discarding the data field, otherwise encoding a second error message into the error field of a second frame, sending the second frame to the first modem and starting the second timer to time out after a second predetermined expiry time;
wherein said second predetermined expiry time is equal to an amount of time required for a retransmitted version of a second given frame to be received at the second modem following starting of the second timer as a result of having determined that the second given frame has uncorrectable errors.

12. A method according to claim 11, wherein the first error message inserted into the error field of the first frame comprises a plurality of bits arranged in a first or a second combination, the first combination indicating that frame retransmission is required and the second combination indicating that no frame retransmission is required.

13. A method according to claim 12, wherein the first and second combinations are complementary and each comprise both logical ones and logical zeroes.

14. A method according to claim 11, wherein each frame further comprises an error correction overhead field, wherein frames transmitted by the first modem are forward error corrected by a forward error correction algorithm and wherein the error correction overhead field of each frame contains results of the error correction algorithm.

15. A method according to claim 14, wherein the step of determining, for each frame in the first set, whether the data field of said frame is error-free, contains correctable errors or contains uncorrectable errors consists of executing a forward error correction algorithm on the error correction overhead field of said frame.

16. A method according to claim 11, further comprising the steps of:
the first modem receiving a second set of frames from the second modem, including the second frame;
the first modem detecting the second error message in the error field of the second frame;
the first modem retransmitting to the second modem at least the frame having caused the second modem to start the second timer; and
the second modem receiving retransmitted frames from the first modem.

17. A method according to claim 16, further comprising the step of the first modem further retransmitting all other frames in the second set of frames since the frame having caused the second modem to start the second timer.

18. A method according to claim 16, further comprising the step of the first modem identifying with an additional tag bit each retransmitted frame in the second set of frames.

19. A method according to claim 16, wherein the second timer has an expiry time equal to the sum of:
the time delay for the second modem to encode the second error message into the error field of the second frame and to send the second frame to the first modem;

the time delay for the first modem to receive the second frame;

the time delay for the first modem to detect the second error message in the error field of the second frame;

the time delay for the first modem to retransmit a second retransmitted frame;

the time delay for the second modem to receive the second retransmitted frame from the first modem.

20. A method according to claim 19, wherein the expiry time of the second timer is determined by the first and second modems executing a handshaking routine.

21. A method of communicating frames of digital data across a communications medium extending between a first modem and a second modem, each frame comprising a data field and an error field, the first modem having a first startable timer, comprising the steps of:

the first modem receiving a first set of frames sent by the second modem;

for each frame in the first set, the first modem verifying whether the first timer is running and if so, discarding the data field in the frame; otherwise, the first modem determining whether the data field in the frame is error-free, contains correctable errors or contains uncorrectable errors;

if the data field is error-free, the first modem sending the data field to a first digital interface;

if the data field contains correctable errors, the first modem correcting said errors and sending the corrected data field to the first digital interface;

if the data field contains uncorrectable errors, the first modem discarding the data field, encoding a first error message into the error field of a first frame, sending the first frame to the second modem and starting the first timer to time out after a predetermined expiry time;

wherein said predetermined expiry time is equal to an amount of time required for a retransmitted version of a given frame to be received at the first modem following starting of the first timer as a result of having determined that the given frame has uncorrectable errors.

22. A method according to claim 21, further comprising the steps of:

the second modem receiving a second set of frames from the first modem, including the first frame;

the second modem detecting the first error message in the error field of the first frame;

the second modem retransmitting to the first modem at least the frame having caused the first modem to start the first timer; and the first modem receiving retransmitted frames from the second modem.

23. A method according to claim 22, the second modem having a second startable timer, the method further comprising the steps of:

for each frame in the second set, the second modem verifying whether the second timer is running and if so, discarding the data field in the frame; otherwise, the second modem determining whether the data field in the frame is error-free, contains correctable errors or contains uncorrectable errors;

if the data field is error-free, the second modem sending the data field to a second digital interface;

if the data field contains correctable errors, the second modem correcting said errors and sending the corrected data field to the second digital interface;

if the data field contains uncorrectable errors, the second modem discarding the data field, encoding a second error message into the error field of a second frame, sending the second frame to the first modem and starting the second timer to time out after a second predetermined expiry time;

wherein said second predetermined expiry time is equal to an amount of time required for a retransmitted version of a second given frame to be received at the second modem following starting of the second timer as a result of having determined that the second given frame has uncorrectable errors.

24. A method according to claim 23, further comprising the steps of:

the first modem receiving a second set of frames from the second modem, including the second frame;

the first modem detecting the second error message in the error field of the second frame;

the first modem retransmitting to the second modem at least the frame having caused the second modem to start the second timer; and the second modem receiving retransmitted frames from the first modem.

25. A modem comprising:

an error message detector capable of detecting a retransmission request in at least one frame of a received stream of frames and producing a retransmission request message therefrom;

an error correction decoder connected to the error message detector, said error correction decoder comprising a startable timer with an expiry time and being operable to determine for each frame in the received stream of frames, whether the frame is error-free, contains correctable errors or contains uncorrectable errors; if the frame is error-free, verifying whether the time is running and if so, discarding the frame;if the frame contains correctable errors, correcting said errors and verifying whether the time is running and if so, discarding the frame; if the frame contains uncorrectable errors, verifying whether the time is running and if so, discarding the frame, otherwise generating an error message and starting the timer to time out after a predetermined expiry time equal to an amount of time required for a retransmitted version of a given frame to be received at the first modem following starting of the timer as a result of having determined that the given frame has uncorrectable errors;

an error message inserter connected to the error correction decoder, for encoding the error message received from the error correction decoder into at least one frame in a transmitted stream of frames; and a digital interface connected to the error message detector and to the error message inserter, adapted to provide the transmitted stream of frames to the error message inserter and further adapted to cause re-transmission of previously transmitted portions of the transmitted stream of frames upon receipt of the retransmission request message from the error message detector.

26. An error decoder comprising:

a startable timer;

means for receiving a stream of frames, each frame having a data field and an error field; and means for processing each frame in the stream of frames;

wherein the processing means is adapted to verify, for each received frame in the stream of frames, whether the timer is running and, if so, to discard the data field of the received frame;

wherein the processing means is further adapted to determine, for each received frame that is not discarded, whether the data field in the received frame requires re-transmission and, is so, to start the timer to time out after a predetermined expiry time equal to an amount of time required for a retransmitted version of a given frame to be received at the first modem following starting of the timer as a result of having determined that the given frame requires retransmission.

27. A method of communicating frames of digital data across a communications medium extending between a first modem and a second modem, each frame comprising a data field and an error field, the first modem having a first startable time, comprising the steps of:

the first modem receiving a first set of frames sent by the second modem;

for each frame in the first set, the first modem verifying whether the first timer is running and if so, discarding the data field in the frame; otherwise, the first modem determining whether the data field in each frame not discarded requires retransmission and, if so, the first modem discarding the data field, encoding a first error message into the error field of a first frame, sending the first frame to the second modem and starting the first timer to time out after a predetermined expiry time;

wherein said predetermined expiry time is equal to an amount of time required for a retransmitted version of a given frame to be received at the first modem following starting of the first timer as a result of having determined that the given frame requires retransmission.

* * * * *